United States Patent [19]

Agoston

[11] Patent Number: 4,678,345

[45] Date of Patent: Jul. 7, 1987

[54] EQUIVALENT TIME PSEUDORANDOM SAMPLING SYSTEM

[75] Inventor: Agoston Agoston, Beaverton, Oreg.

[73] Assignee: Tektronix, Inc., Beaverton, Oreg.

[21] Appl. No.: 858,424

[22] Filed: May 1, 1986

[51] Int. Cl.$^4$ .................... G04F 8/00; G03K 21/32
[52] U.S. Cl. .................... 368/119; 368/120; 377/20; 324/77 R
[58] Field of Search .................... 368/113, 118–120; 324/77 R, 77 A, 77 C; 307/516; 364/484, 487; 377/19, 20

[56] References Cited

U.S. PATENT DOCUMENTS

| | | | |
|---|---|---|---|
| 4,164,648 | 8/1979 | Chu | 368/118 X |
| 4,165,459 | 8/1979 | Curtice | 368/119 |
| 4,383,166 | 5/1983 | Chu et al. | 377/20 |
| 4,507,740 | 3/1985 | Star et al. | 324/77 R |

Primary Examiner—Vit W. Miska
Attorney, Agent, or Firm—John Smith-Hill; George T. Noe

[57] ABSTRACT

An equivalent time pseudorandom sampling system samples a repetitive waveform within each of several narrow acquisition windows bounding repetitive sections of the waveform in order to obtain equivalent time sample data characterizing the shape of the waveform included within the acquisition windows. The period between successive triggering events is measured and sampling is delayed following an initiating triggering event by delay time adjusted according to the measured period so as to maximize the probability that sampling will occur within an acquisition window. The time difference between samples and subsequent triggering event is measured with high accuracy and resolution utilizing a time interval measurement system based on a dual vernier interpolation.

13 Claims, 6 Drawing Figures

EQUIVALENT TIME PSEUDORANDOM SAMPLING SYSTEM

BACKGROUND OF THE INVENTION

The present invention relates in general to waveform sampling systems and more particularly to a pseudorandom sampling system wherein a repetitive waveform is sampled at a predetermined time following a triggering event in a waveform and wherein the time interval between the sample and a subsequent triggering event is accurately measured.

A typical waveform sampling system repetitively strobes a sampling gate to sample a waveform at several points and the analog samples obtained are converted into digital data and stored in memory. In order to accurately characterize the shape of a sampled waveform, sample data should convey not only the magnitude of each waveform sample but the relative timing of each sample with respect to a triggering event (such as a zero crossing) in the waveform. Sequential and random sampling systems each provide timing information in a different way. Sequential sampling systems typically sample the waveform at predetermined regular time intervals following a triggering event in the waveform being sampled. The sampled waveform magnitude data is stored in memory in the order that it is acquired and since the sample timing is regular and predetermined, the position of the sample data in the memory is indicative of relative timing. In random sampling systems, sampling strobe signals are not synchronized to triggering events in the waveform and therefore the timing of each sampling strobe is "random" with respect to triggering events and not predetermined. Thus in random sampling systems it is necessary to measure the time interval between each sample and a triggering event in the waveform in order to determine the relative timing of each sample. The measured timing data is stored in memory along with the sampled waveform magnitude data.

Sampling systems are also characterized as to whether they perform real time or equivalent time sampling. In real time sampling systems a single section of a waveform is sampled and the resolution of the sampling, i.e., the maximum time between samples, depends entirely on the sampling frequency. Real time sampling is most suitable for non-repetitive or relatively low frequency periodic waveforms.

The equivalent time sampling method is used to obtain data characterizing a repeating section of a relatively high frequency, repetitive waveform. In equivalent time sampling, the waveform is sampled one or more times during each of several successive "acquisition windows", each acquisition window comprising a time period bounding a different repetition of the particular section of the waveform to be sampled. In sequential equivalent time sampling systems, a repetitive triggering event in the waveform occurring at some known time with respect to each acquisition window initiates sampling during each acquisition window. The initiation of sampling is delayed by differing predetermined times after each triggering event so that sampling occurs at different relative times within each acquisition window. The sample data is then ordered according to the relative sampling time within an acquisition window rather than according to the actual order in which the sample data was acquired. In random equivalent time sampling systems, sampling times and triggering events are not synchronized but the time interval between samples within each acquisition window and a triggering event associated with the window is measured.

The resolution of sequential sampling systems depends on the resolution in control over sample timing delay while the resolution of random sampling systems depends on the resolution in measurement of the time differences between sampling strobes and triggering events. In sequential equivalent time sampling the timing of each sample is predetermined and there is essentially a one hundred percent probability that each sample will be taken within an acquisition window. However in random equivalent time sampling systems, the timing of each sample is not predetermined and many samples may be taken outside the intended acquisition window and must be discarded. The controllability of sample timing within an acquisition window afforded by sequential sampling permits samples to be taken at evenly spaced relative times within the acquisition windows such that a minimum number of samples are required to obtain a given resolution while in random sampling systems samples are not necessarily evenly spaced and more samples must be taken in order to achieve the same degree of resolution. Therefore when the sampling frequency for random and sequential equivalent time sampling is comparable, the random sampling method requires more time to achieve a desired degree of sampling resolution than sequential sampling.

Due to practical limitations of sequential sampling strobe drive circuitry, a triggering event must precede an acquisition window by a certain amount of time. If the triggering event is in the acquisition window, samples cannot be taken before the triggering event and therefore the entire window cannot be sampled. A triggering event occurring during one acquisition window may be utilized to trigger sampling for a subsequent acquisition window. However in such systems waveform "jitter" reduces sampling accuracy. Not all repetitive waveforms are periodic since the time between repetitive waveform sections in "jittery" waveforms may vary and the sample timing within an acquisition window may vary from expectations if the triggering event occurs outside the acquisition window. Consequently, in many equivalent time sequential sampling systems the sampled waveform is delayed following trigger pickoff, before being applied to the sampling gate, so that a triggering event within an acquisition window may be utilized to trigger sampling over the full range of the sample of the acquisition window. However, delay circuits may distort some waveforms to an intolerable degree and must be periodically measured to ensure that the delay time is accurately known.

What is needed is a method and apparatus for sampling a waveform with high resolution and high speed which is not subject to error due to waveform jitter and which does not require the delay of the waveform being sampled.

SUMMARY OF THE INVENTION

In accordance with one aspect of the invention an equivalent time pseudorandom sampling system samples a repetitive waveform within each of several narrow acquisition windows positioned at similar times with respect to similar triggering events along the waveform in order to obtain equivalent time sample data characterizing the shape of a waveform section included within each acquisition window. The period between successive triggering events is measured and sampling is delayed following an initiating triggering event by a delay time which is adjusted according to the measured period between triggering events so as to maximize the probability that sampling will occur within an acquisition window. The time difference between each sample and a triggering event within or near the acquisition window bounding the sample is then measured in order to accurately determine the timing of the sample with respect to the triggering event. The equivalent time pseudorandom sampling system of the present invention improves the data acquisition speed over prior art equivalent time random sampling systems by maximizing the number of samples taken within an acquisition window. The effect of waveform jitter is reduced by accurately measuring sample timing with respect to triggering events and there is no need to delay the waveform between trigger pickoff and sampling.

In accordance with another aspect of the invention, the relative timing within an acquisition window of each successive sample is delayed by regularly increasing time intervals so that samples are taken at substantially evenly spaced relative times within the acquisition windows, thereby minimizing the number of samples required to achieve a given sampling resolution.

In accordance with another aspect of the invention, the time intervals between waveform samples and triggering events are measured with high accuracy utilizing a novel time interval measurement system based on dual vernier interpolation. The strobe and triggering events each trigger the periodic output signal of a separate triggerable oscillator, each operating at a frequency differing slightly from the frequency of a surface acoustic wave (SAW) generator which periodically produces a reference signal. The triggering of one triggerable oscillator starts a count of the SAW generator output signals while the triggering of the other triggerable oscillator stops the count. The completed count is thus a gross measurement of the time interval between the strobe and the trigger. The phase differences between the first SAW strobe signal counted and the triggering of the first oscillator and between the last SAW strobe signal counted and the triggering of the second oscillator are also measured and used to finely adjust the measured time interval between the triggering events and strobe signals.

It is accordingly an object of the invention to provide an new and improved pseudorandom equivalent time waveform sampling system capable of sampling high speed repetitive waveforms with high accuracy, high resolution and high speed.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings, wherein like reference characters refer to like elements.

DRAWINGS

DETAILED DESCRIPTION

Figure 1:
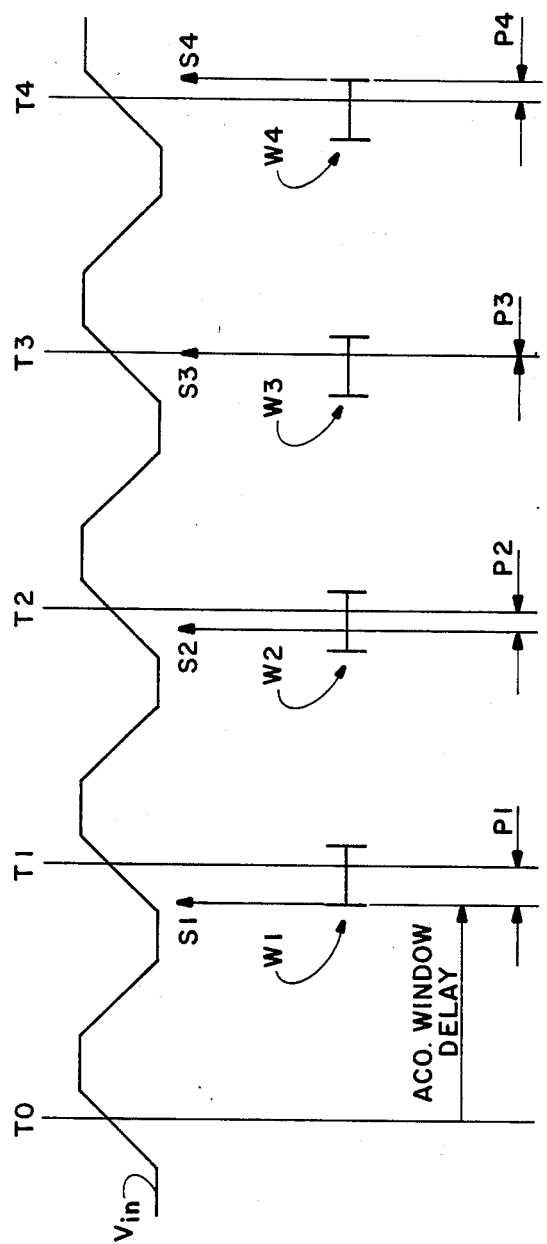
FIG. 1 shows a timing diagram depicting the operation of the equivalent time pseudorandom time sampling system according to the present invention.

FIG. 1 shows a timing diagram illustrating equivalent time pseudorandom sampling according to the present invention. A repetitive input waveform Vin is sampled during each of four successive acquisition windows (W1–W4), each coinciding with a separate instance of a repetitive section of the input waveform. Each of four waveform samples is initiated by one of a sequence of four sampling strobes (S1–S4). In the example of FIG. 1, strobe S1 occurs at the beginning of acquisition window W1, strobe S2 occurs after the beginning of acquisition window W2 (about one-third of the time through the window), strobe S3 occurs within window W3 (about two-thirds of the time through the window), and strobe S4 occurs at the end of acquisition window W4. If each waveform sample is converted into a representative digital quantity and stored in memory, the stored data can be utilized to recreate the approximate shape of the waveform section within the acquisition windows, provided that the relative timing of each sample within a acquisition window is known. Accordingly the times (P1–P4) between each strobe signal S1–S4 and a corresponding triggering event T1–T4 (such as a zero crossing in the input waveform) occurring within or near the same acquisition window as the corresponding strobe signal is measured. This measured time interval may also be stored in memory along with the waveform magnitude data, and when the magnitude and timing data are displayed as dots on a screen with each dot having a vertical elevation proportional to the corresponding sample magnitude data and a horizontal position proportional to the measured timing data, the result approximates the shape of the waveform during the acquisition window.

The strobe signals are initiated in delayed response to a triggering event. For instance, strobe signal S1 is initiated in responde to a triggering event T0 occurring in the input waveform Vin during a cycle of the waveform preceding acquisition window W1. Similarly, strobe signal S2 is generated in delayed response to triggering event T1, strobe S3 is generated in response to triggering event T2 and strobe S4 is generated in response to triggering event T3. According to the present invention, the delay between a triggering event and the strobe that it initiates is adjusted so that the strobe is most likely to occur within the corresponding sampling window and so that the position of each successive strobe is progressively delayed by a regular amount of time with respect to the triggering event. In order to determine the acquisition window delay time, i.e., the time between a triggering event and the next section of the waveform to be sampled, the period between triggering events (not shown) occurring before triggering event T0 is measured and used as a predictor of when triggering events T1–T4 will occur with respect to triggering event T0. The delay times between triggering events T0-T3 and strobe signals S1-S4, respectively, are then adjusted so that strobe signals S1-S4 are generated at predetermined, regularly incremented times with respect to the predicted timing of corresponding triggering events T1-T4. Although for simplicity the example of FIG. 1 shows only four strobes, many more samples may be taken, the relative sampling times of successive samples being progressively increased by smaller amounts to provide higher sampling resolution.

The use of the premeasured time interval between prior triggering events as a predictor of the time interval between subsequent triggering events enables strobe signal timing to be controlled so as to maximize the probability that each strobe signal will be generated within an acquisition window, even when the acquisition window is relatively narrow. By subsequently measuring the actual time interval between each strobe signal and a triggering event within or near the acquisition window to determine the actual timing of each strobe, the effect of input waveform jitter on sampling accuracy is minimized.

Figure 2:
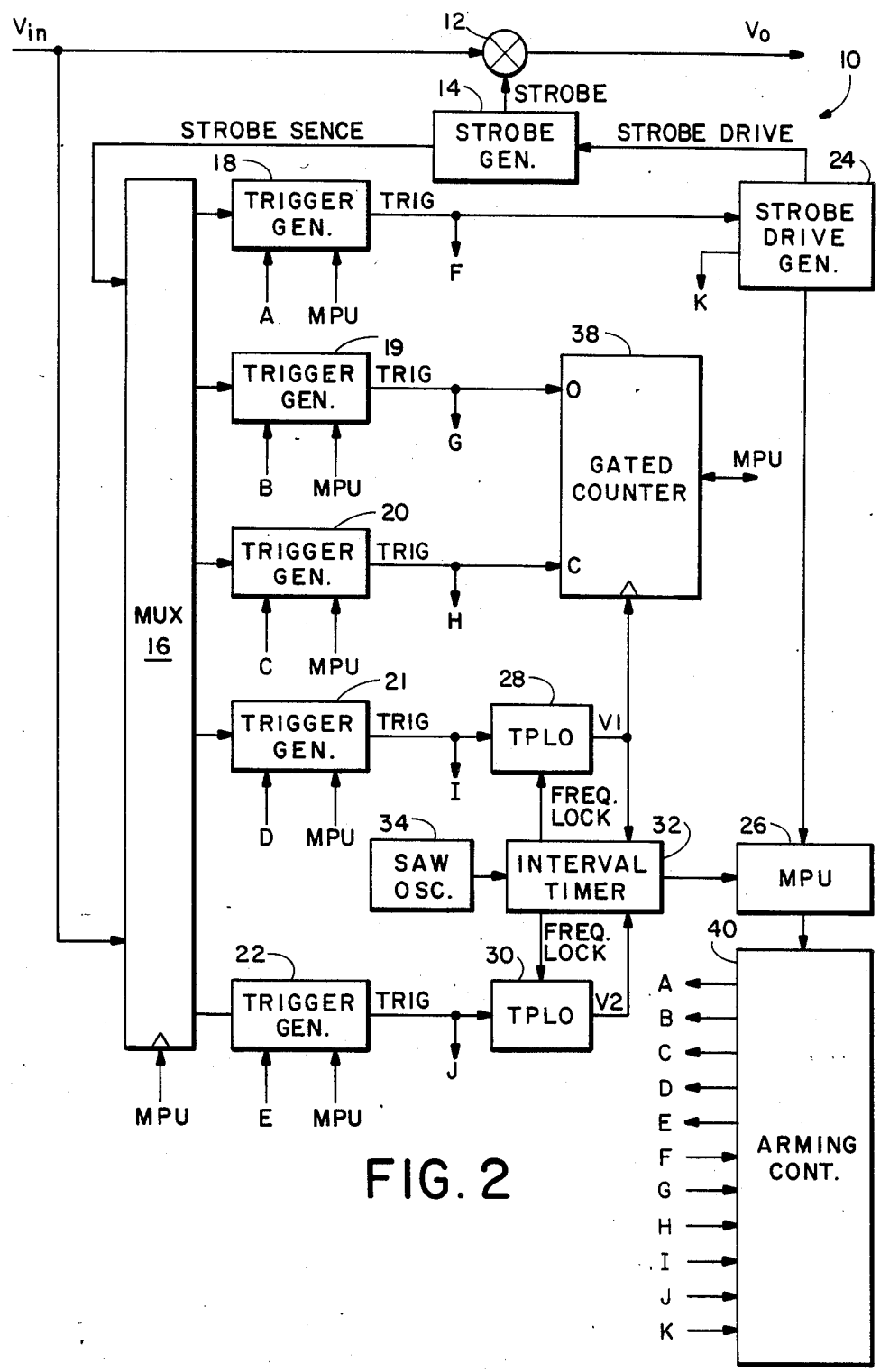
FIG. 2 is a block diagram of the equivalent time pseudorandom time sampling system according to the present invention.

Referring to FIG. 2, depicting in block diagram form the equivalent time pseudorandom sampling system 10 according to the present invention, sampling system 10 includes a sampling gate 12 for sampling the input waveform Vin on each occurrence of a strobe signal in order to produce an output voltage sample Vo. The strobe signal is generated by a strobe generator 14 in response to an input strobe drive signal. At the same time, strobe generator 14 also generates a strobe sense signal which is applied as an input to a multiplexer 16. The Vin signal is also provided to another input of multiplexer 16. Multiplexer 16 has five outputs, each connected to a separate trigger generator 18-22, and the multiplexer is adapted to selectively connect any one of its inputs to any one or more of the trigger generators.

The triggering event recognized by trigger generators 18-22 is the crossing of a predetermined level by an input waveform, the level being determined by data supplied by microprocessor 26. When generator 18 produces an output trigger signal in response to a triggering event in an input signal from multiplexer 16, its output trigger signal is transmitted to a strobe drive generator 24. After a predetermined delay time following the trigger signal produced by trigger generator 18, strobe drive generator 24 produces the strobe drive signal which initiates operation of the strobe generator 14.

When trigger generator 21 produces an output trigger signal in response to a predetermined triggering event in its input signal, this trigger signal triggers a triggered phase-locked oscillator (TPLO) 28. On receipt of the trigger signal from trigger generator 21, TPLO 28 stops and restarts its periodic output signal V1 such the the V1 signal is synchronized to the trigger signal. The trigger signal output of trigger generator 22 is applied as a triggering input to another TPLO 30 which also stops and restarts is periodic output signal V2 in response to the triggering input. The V1 output signal of TPLO 28 and the V2 output signal of TPLO 30 are applied as inputs to an interval timer circuit 32 adapted to measure the time interval between the restarting of the V1 and V2 signals and to provide data indicating the measured time intervals to a microprocessor (MPU) 26. A surface acoustic wave (SAW) oscillator 34 provides a reference signal which interval timer circuit 32 utilizes when determining the time interval between the triggering of TPLO 28 and TPLO 30. The interval timer circuit also provides signals which frequency lock the V1 and V2 signals to predetermined frequencies using the SAW oscillator 34 frequency as a reference.

The trigger signal outputs of trigger generators 19 and 20 are connected to gate open (O) and gate close (C) inputs of a gated counter 38. Counter 38 counts the cycles of the output signal V1 from TPLO 28 which occur after the trigger signal produced by trigger generator 19 and before the trigger signal produced by trigger generator 20. The count data is then provided to microprocessor 26.

Each trigger generator 18-22 is armed by a signal from an arming controller 40, suitably comprising a state machine programmed by data from microprocessor 26, and each trigger generator 18-22 transmits an indicating signal to arming controller 40 whenever it detects a triggering event.

In order to measure the period between successive triggering events in the Vin waveform, microprocessor 26 switches multiplexer 16 so that it supplies the Vin waveform as input to both trigger generators 19 and 20 and programs arming controller 40 to alternately arm trigger generators 19 and 20. After trigger generator 19 detects a triggering event in the Vin waveform, it generates its trigger signal output to start the count of cycles of the V1 output signal of TPLO 28 by period counter 38. Trigger generator 19 also transmits a signal to the arming controller 40 indicating that the triggering event has been recognized. In response to the indicating signal, the arming controller 40 immediately disarms trigger generator 19 and arms trigger generator 20 so that trigger generator 20 generates its output trigger signal on detection of the next triggering event in the Vin waveform in order to stop the count of period counter 38. When the trigger generator 20 transmits its indicating signal back to the arming controller 40, the arming controller sends a signal to the microprocessor telling it that it may read and reset the count in period counter 38. The period between the successive triggering events can be determined by dividing the count by the frequency of the V1 signal output of TPLO 28.

The microprocessor 26 then utilizes the measured period data when setting the delays between the trigger output of trigger generator 18 and the strobe drive signal produced by strobe drive generator 24 so as to properly time the strobe signals applied to the sampling gate 12. The microprocessor also supplies count limit data to each trigger generator 18-20 which tells the trigger generator to initiate a trigger signal only after a predetermined number of trigger signals have been generated. Thus, for instance, if trigger generator 20 is told to initiate a trigger only after detecting 10 trigger signals, the resulting count produced by counter 38 can be used to determine an average period between triggering events. The use of of an averaging measurement is preferable when the input waveform is subject to random jitter.

Prior to an equivalent time pseudorandom sampling operation, microprocessor 26 sets trigger generator 21 to detect a predetermined triggering event in the Vin waveform and sets trigger generator 22 to detect the occurrence of the strobe sense signal produced by strobe generator 14 so that interval timer 32 measures the time intervals between triggering events and strobe sense signals. Referring to both FIGS. 1 and 2, the initial triggering event T0 causes trigger generator 18 to transmit its output trigger signal to stribe drive generator 24 which produces a strobe drive signal at a predetermined delay time following the trigger signal, the delay time being predetermined by data previously supplied to the strobe drive generator 24 by the microprocessor 26. The strobe drive signal causes the strobe generator 14 to generate strobe signal S1 along with a strobe sense signal. The strobe sense signal is transmitted through multiplexer 16 to the trigger generator 22 which causes trigger generator 22 to trigger (stop and restart) the output of TPLO 30. When the output signal V2 of TPLO 30 is triggered, interval timer 32 begins an interval measurement. On detection of triggering event T1, trigger generator 21 produces its output trigger signal which triggers the V1 output signal of TPLO 28 thereby marking the end of the interval measured by interval timer 32. Thus the interval timer 32 measures the time interval P1 of FIG. 1 between the strobe signal S1 and the triggering event T1.

The triggering event T1 also causes trigger generator 18 to produce another trigger signal provided to strobe drive generator 24 causing strobe drive generator 24 to produce a second strobe drive signal in order to initiate strobe signal S2. The timing between triggering event T1 and strobe signal S2 is also determined by data previously provided to the strobe drive generator 24 by the microprocessor 26. When strobe generator 14 produces strobe signal S2 it produces a second strobe sense signal which is transmitted through multiplexer 16 to trigger generator 22 thereby causing trigger generator 22 to initiate a second triggering signal, retriggering the TPLO 30, and starting another time interval measurement. When trigger generator 21 detects triggering event T2, it retriggers TPLO 28 to mark the end of the interval measured by interval timer 32. Thus the output of interval timer 32 now represents the period P2 between the strobe signal S2 and the triggering event T2. The process continues such that the interval timer 32 successively measures the period P3 between the strobe signal S3 and event T3 and the period P4 between the event T4 and the strobe signal S4. The interval timer 32 is adapted to measure the interval between the initiation of V1 and V2 regardless of which signal is initiated first. Therefore in the case of period P4 between the triggering event T4 and the strobe signal S4, the triggering of TPLO 28 initiates interval measurement while the triggering of TPLO 30 in response to the strobe sense signal terminates the interval measurement.

Figure 3:
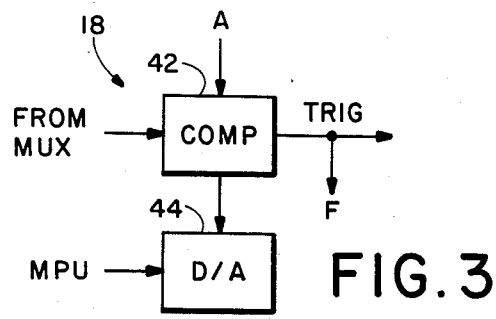
FIG. 3 is a block diagram of a typical trigger generator of the sampling system of FIG. 2.

Referring to FIG. 3, depicting in more detailed block diagram form trigger generator 18 of FIG. 2, the trigger generator includes a comparator 42 for producing an output pulse the first time the magnitude of the output signal from the multiplexer 16 of FIG. 2 rises above an output signal of a digital-to-analog converter 44 following receipt of an arming signal A from the arming controller 40 of FIG. 2. The magnitude of the output signal of converter 44 is determined by data from the microprocessor 26 of FIG. 2. The trigger signal output of comparator 42 is applied as an input F to the arming controller 40 of FIG. 2. Trigger generators 19–22 are similar to trigger generator 18 of FIG. 3.

Figure 4:
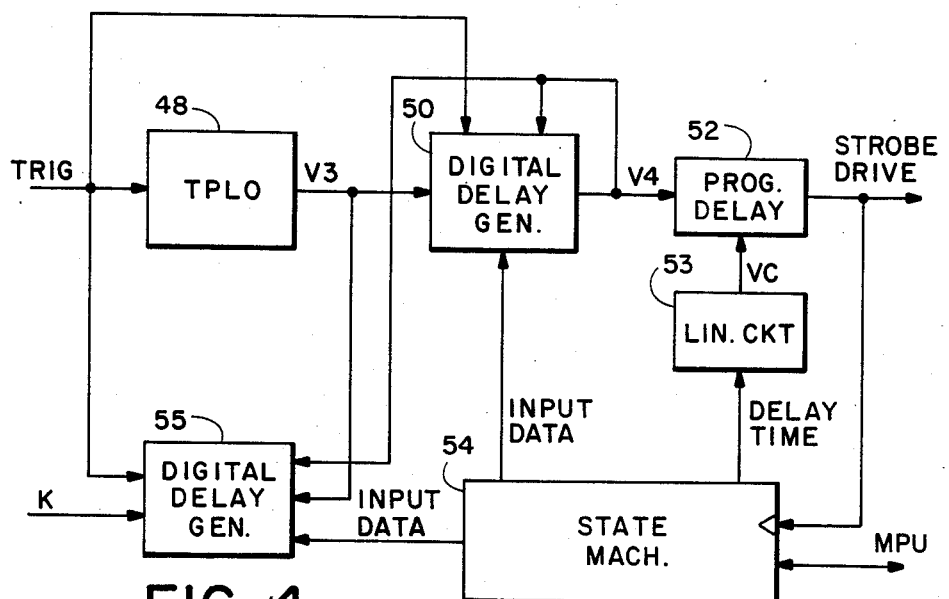
FIG. 4 is a block diagram of the strobe drive generator circuit of FIG. 2.

A strobe drive circuit suitable for use as strobe drive generator 24 of FIG. 2 is described in detail in co-pending U.S. patent application Ser. No. 06/858,490 filed Apr. 30, 1986. Referring to FIG. 4, depicting in more detailed block diagram form the strobe drive generator 24 of FIG. 2, strobe drive generator 24 includes a triggered phase-locked oscillator (TPLO) 48 which stops and restarts a periodic output signal V3 when triggered by a trigger signal produced by trigger generator 18 of FIG. 2. The trigger signal is also applied to an enable input of a low jitter digital delay generator 50 similar to a delay generator described in copending U.S. patent application Ser. No. 06/845,282 filed Mar. 28, 1986. The V3 output signal of TPLO 48 is applied to a count input of delay circuit 50 and when the trigger signal is asserted, the delay circuit begins decrementing a prestored number, the number being decremented by one on each cycle of the V3 signal. When the stored number reaches zero, the delay circuit 50 outputs a pulse V4 to a programmable delay circuit 52. Delay circuit 52 delays the V4 pulse by a delay time determined by an applied control voltage Vc in order to produce the strobe drive output signal of the strobe drive generator 24. The V4 pulse is also fed back to a data load input of delay generator 50 which causes delay generator 50 to stop counting and to load a new number for starting a new count down when enabled by the next occurrence of a trigger signal.

The input data for the delay generator 50 and the predetermined delay time of programmable delay circuit 52 are controlled by data from the state machine 54 which is clocked by the strobe drive signal. The delay time data output of state machine 54 is converted to the control voltage Vc by a linearizing circuit 53 adapted to linearize changes in time delay of delay circuit 52 with respect to changes in delay time data provided by state machine 54. A circuit suitable for use as programmable delay circuit 52 is described in co-pending patent application Ser. No. 06/846,320 filed Mar. 31, 1986 and a circuit suitable for use as linearizing circuit 53 is described in co-pending patent application Ser. No. 06/846,319 filed Mar. 31, 1986.

The input data applied to delay generator 50 grossly adjusts strobe delay while the delay time data transmitted to linearizing circuit 53 finely adjusts the strobe delay. Prior to a sampling operation, but after determining the nominal period between successive triggering events, microprocessor 26 of FIG. 2 programs state machine 54 to properly adjust the delays between successive trigger signals and the output strobe drive signal. In the example illustrated in FIG. 1, state machine 54 is programmed to step through four separate states, one for each strobe signal. While in a first state, state machine 54 generates delay control data sufficient to provide the appropriate delay between triggering event T0 in the input waveform Vin and the strobe signal S1. When the strobe drive signal initiating strobe signal S1 is generated by the programmable delay circuit 52, the strobe drive signal switches the state machine 54 to a second state in which the data output of the state machine increases the delay between the trigger and strobe drive signal to the interval required between triggering event T1 and strobe signal S2 as shown in FIG. 1. When the strobe drive signal initiating strobe signal S2 is produced, state machine 54 switches to a third state wherein the delay is increased once again to the time interval required between triggering event T3 and strobe signal S4 of FIG. 1. When the last strobe drive signal is generated, state machine 54 transmits a signal back to microprocessor 26 indicating the end of a sampling cycle.

The periodic output signal V3 of the TPLO 48 is also applied to the count input of another digital delay generator 55, similar to delay generator 50. The trigger signal and the V4 signal are also applied to the count enable and data load control inputs of delay generator 55 and the state machine 54 also supplies input data to delay generator 55. When a V4 pulse is generated, delay generator 55 stores input data from state machine 54 and, when subsequently enabled by the trigger signal, begins decrementing the stored input data by one on each cycle of the V3 signal. When the stored input data is decremented to zero, delay generator transmits an indicating signal K to the arming controller 40 of FIG. 2. The arming controller then transmits an arming signal A to the trigger generator 18 of FIG. 2, which permits the trigger generator to produce another trigger signal on occurrence of the next triggering event. The input data provided to delay generator 55 is adjusted to prevent trigger generator 18 from retriggering the TPLO 48 until a strobe drive signal has been generated in response to the last trigger signal. This feature is necessary when a very high frequency waveform is being sampled and not every triggering event is to initiate a sampling strobe.

Figure 5:
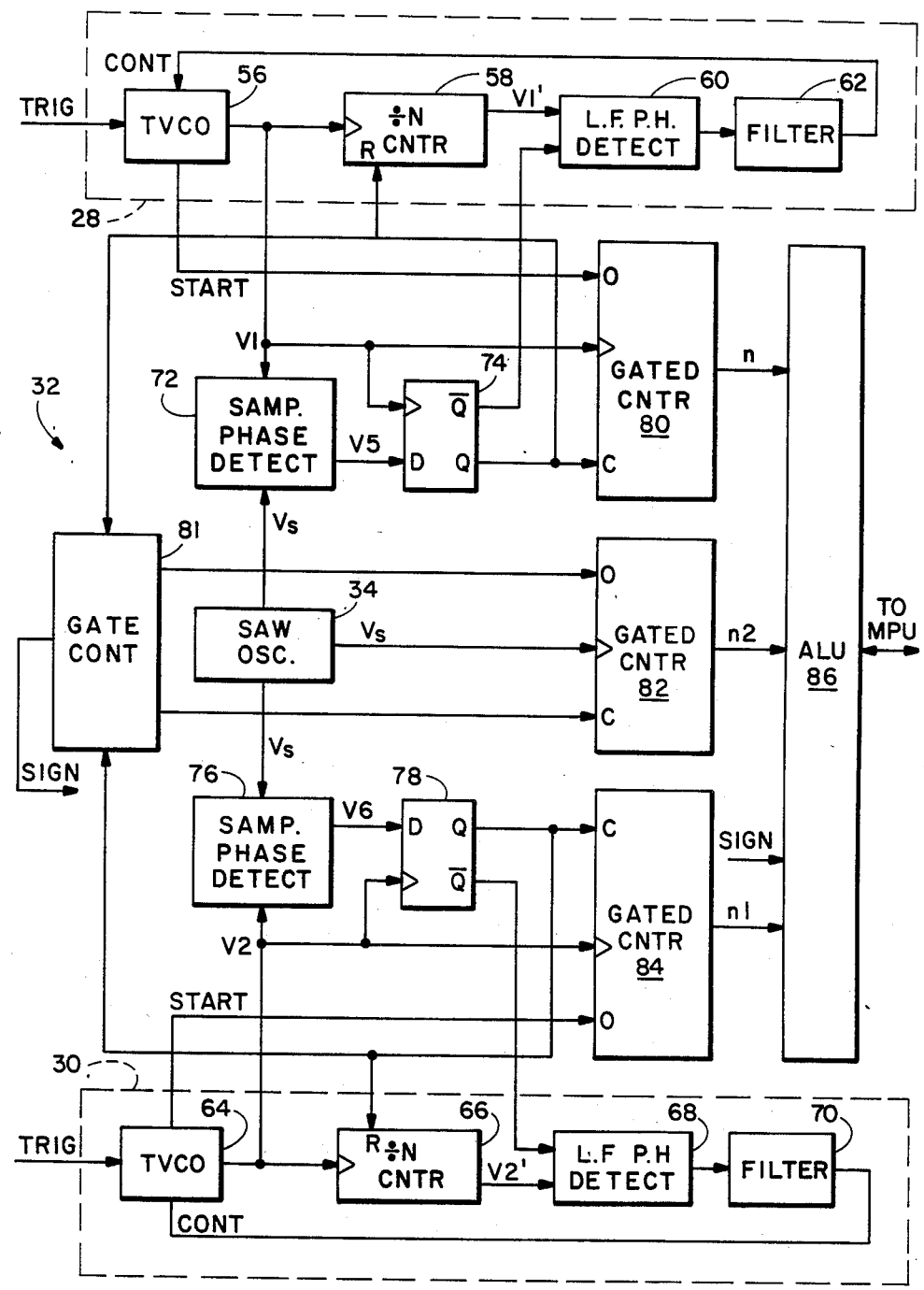
FIG. 5 is a block diagram showing the phase locked oscillators and the interval timer of FIG. 2 in more detail.

Referring to FIG. 5 depicting in more detailed block diagram form the triggered phase-locked oscillators 28 and 30 and the interval timer circuit 32 of FIG. 2, TPLO 28 includes a triggered, voltage-controlled oscillator (TVCO) 56, a divide-by-N counter 58, low frequency phase detector 60, and a filter circuit 62. The trigger signal from the trigger generator 21 of FIG. 2 triggers TVCO 56 which stops and restarts the V1 output signal of the TPLO 28 so as to synchronize the V1 signal to the trigger signal. The V1 output signal clocks the divide-by-N counter 58 which produces an output signal V1' lower in frequency than V1 by a factor of N. The V1' signal is applied to the reference input of the low frequency phase detector 60 which produces an output signal equal to the difference in magnitude between the V1' signal and the frequency locking signal produced by the interval timer circuit 32. The output signal of the low frequency phase detector 60 is integrated by filter 62 and then applied to TVCO 56 as its frequency controlling voltage.

The V1 signal output of TVCO 56 and the output signal of SAW oscillator 34 are applied as inputs to a sampling phase detection circuit 72. A circuit suitable for use as phase detector circuit 72 is described in detail in co-pending U.S. patent application Ser. No. 06/858,428 filed May 1, 1986 and a circuit suitable for use as saw oscillator 34 is described in detail in co-pending U.S. patent application Ser. No. 06/858,485 filed Apr. 30, 1986. Phase detection circuit 72 samples the V1 input waveform on each occurrence of a strobe output signal produced by the SAW oscillator 34 and produces an output signal V5 whenever the sampled V1 signal falls below zero potential. The output signal V5 is applied to a D input of a flip-flop 74 clocked by the V1 output signal of TVCO 56. The inverted Q output of flip-flop 74 provides the frequency-locking signal applied to a non-inverting input of phase detector 60 while the Q output of the flip-flop resets the divide-by-N counter 58.

The TVCO 56 operates continuously, the stopping and restarting of TVCO 56 by the trigger signal from trigger generator 18 of FIG. 2 being substantially instantaneous. In the preferred embodiment of the invention, the SAW oscillator 34 operates at a frequency of 315.457 megahertz and the count limit N of counter 58 is 4096. In this arrangement the frequency difference between the output Vs of the SAW oscillator 34 and the output V1 of TVCO 56 must be such that the output signal V5 of phase detector 72 oscillates at the same frequency as the output V1' of divide-by-N counter 58. This occurs when the output signal of TVCO 56 is $(N+1)/N$ times the frequency of the SAW oscillator output signal, i.e., when V1 is 315.380 megahertz.

Figure 6:
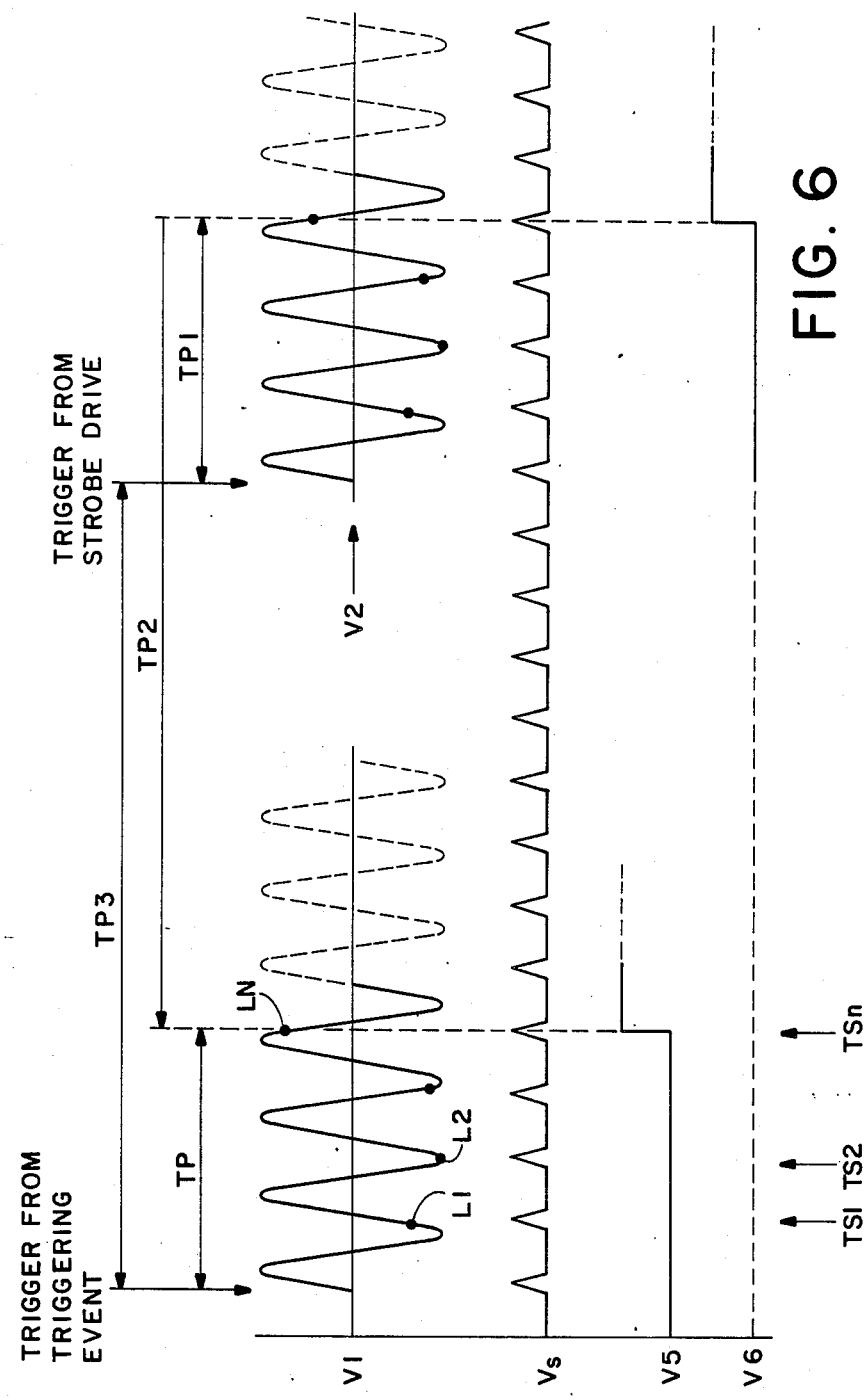
FIG. 6 shows a timing diagram of the operation of the phase detectors of FIG. 5.

Referring to FIG. 6, showing a timing diagram of the operation of phase detector 72, the phase detector is adapted to sample the V1 input waveform on each occurrence of strobe signal Vs output of SAW oscillator 34. Since the strobe signal Vs is of a slightly higher frequency than the oscillator output signal V1, the phase detector 72 samples the oscillator output signal at a progressively earlier point on each cycle of the output signal V1. In the example of FIG. 6 the first strobe signal Vs occurring after TVCO 56 of FIG. 3 receives a trigger signal causes the phase detector 72 to sample the TVCO output signal at time TS1 and the next strobe signal causes the phase detector 72 to sample the V1 signal at time TS2. The magnitude of the sample at time TS2 is higher than the sample at time TS1. With each successive strobe signal Vs, the sampled magnitude changes until time TSn when the sampled magnitude of the V1 signal rises above zero. At this point phase detector 72 transmits the V5 pulse to flip-flop 74 of FIG. 5. The number of cycles n of V1 occurring after the trigger signal but before phase detector 72 produces the V5 output signal are counted and the time difference TP between the trigger signal and the point of phase coincidence between the zero crossing of the V1 signal and the Vs signal at time Tn is computed by multiplying n by the step size of the relative phase shift between Vs and V1 after each cycle of V1. In the preferred embodiment of the invention, with Vs at a frequency of 315.457 megahertz and with V1 at a frequency of 315.380 megahertz, the step size and therefore the resolution of the measurement is 0.774 picoseconds. Thus, for example, if n is 100, TP is about 77.4 picoseconds. In FIG. 6 the difference in frequency between the Vs and V1 signals has been exaggerated for illustrative purposes so that the step size is large enough to illustrate the stepping of the sample timing relative to the phase of V1.

Referring again to FIG. 5, TPLO 30 is similar to TPLO 28 and includes a triggered voltage controlled oscillator 64 driving a divide-by-N counter 68, triggered low frequency phase detector 68, and a filter 70, the output of filter 70 being fed back to the frequency control input of TVCO 64. The output of TVCO 64 comprises the V2 signal output of the TPLO 30 which is applied to another sampling phase detector 76, similar to phase detector 72. The output of phase detector 76 is applied to a D input of another flip-flop 78, the inverted Q output of flip-flop 78 being connected as the frequency locking signal to the low frequency phase detector 68. The divide-by-N counter 66 is also set with a count limit of N equal to 4096 and the output strobe signal Vs of SAW oscillator 34 is applied as the strobe signal to phase detector 76. In this arrangement the output signal V2 of TVCO 64 is also maintained at 315.380 megahertz.

The interval timer 32 also includes a set of three gated counters 80, 82 and 84, each having a gate-open control input (O), a gate-close control input (C), and a clock input. Each gated counter counts the number of cycles applied to its clock input following a pulse applied to the gate-open input, the count being terminated by a pulse applied to the gate-close input. The output Vs of SAW oscillator 34 is applied to the clock input of gated counter 82, the output V1 of TVCO 56 is applied to the clock input of gated counter 80 and the output V2 of TVCO 64 is applied to the clock input of gated counter 84. The Q output of flip-flop 74 drives the gate-close terminal of gated counter 80 and the Q output of flip-flop 78 drives the gate-close terminal of gated counter 84. TVCO 56 generates a start signal pulse whenever the trigger generator 18 of FIG. 2 retriggers the output signal V1 of TVCO 56 and the start signal is applied to the gate-open input of counter 80. A similar start signal generated by TVCO 64 is also applied to the gate-open input of counter 84. The Q outputs of flip-flops 74 and 78 are connected to inputs of a gate control circuit 81. Gate control circuit 81 has three outputs, one driving the gate-open input of counter 82, another driving the gate-close input of counter 82 and a third (SIGN) indicating whether the Q output of flip-flop 74 sets before or after the Q output of flip-flop 78. The gate control circuit 81 is a state machine which asserts its gate-open output when the first of either of the Q outputs of flip-flop 74 or 78 is set and asserts its gate-close output when the second Q output sets.

Assuming by way of example that the time difference between a triggering event and a strobe signal is to be measured and that the triggering event appears before the strobe signal, the triggering event detected by trigger generator 21 of FIG. 2 causes the trigger generator 21 to transmit a trigger signal to TVCO 56 of TPLO 28 before the strobe sense signal produced by strobe generator 14 causes trigger generator 22 to transmit a trigger signal to TVCO 56 of the TPLO 30. When the TVCO 56 is triggered, it transmits its start signal to the gate-open terminal of gated counter 80. Gated counter 80 thereupon begins counting cycles of the V1 output signal of TVCO 56. When phase detector 72 detects a next zero crossing in the sampled value of V1, it sets flip-flop 74. The Q output of flip-flop 74 pulses the gate-close input of counter 80 to terminate the count. Thus the ending count n in gate counter 80 represents the time period TP of FIG. 6 between the trigger signal applied to TVCO 56 and the next coincidence between a zero crossing of V1 and a strobe signal Vs. When the gate control circuit 81 detects the Q output of flip-flop 74, it transmits a pulse to the gate-open terminal of counter 82 causing counter 82 to begin counting pulses of the Vs signal output of the SAW oscillator 34.

The trigger signal resulting from the strobe sense signal retriggers TVCO 64 and TVCO 64 generates a start signal pulse which gate opens counter 84 so that counter 84 begins counting pulses of the V2 signal. Phase detector 76 samples the V2 signal produced by TVCO 64 and when it detects a next zero crossing in the sampled value of V2, it sets flip-flop 78. The Q output of flip-flop 78 pulses the gate-close input of counter 84 to terminate its count. Thus the ending count n1 in gated counter 80 represents the time period TP1 of FIG. 6 between the trigger signal applied to TVCO 64 and the next coincidence between a zero crossing of V2 and a strobe signal Vs. When the gate control circuit 81 detects the Q output of flip-flop 78, it transmits a pulse to the gate-close terminal of counter 84 causing counter 84 to stop counting pulses of the Vs signal output of the SAW oscillator 34. The ending count n2 in counter 82 thus is indicative of the period TP2 between the V5 pulse and the V6 pulse. The time period TP3 between the triggering event and the strobe sense signal may be computed according to the following expression:

$$TP3 = Tsaw\{(n2) + [(N+1)(n-n1)/N]\} \quad [1]$$

where Tsaw is the period of the SAW oscillator 34 output signal Vs, N is the setting (4096) of the divide by N counters 58 and 66, n is the ending count in counter 80, n1 is the ending count in counter 84, and n2 is the ending count in counter 82.

When the strobe sense signal occurs before the triggering event, the period TP3 between the trigger signals generated in response to the strobe sense signal and the triggering event is determined by the expression:

$$TP3 = Tsaw\{(n2) + [(N+1)(n1-n)/N]\} \quad [2]$$

The count outputs n, n1 and n2 of gated counters 80, 84 and 82, along with the SIGN signal output of gate control circuit 81 are applied to an arithmetic logic unit (ALU) 86 which computes the above, depending on the state of the SIGN signal indicating whether the triggering event or the strobe drive signal occurred first. The ALU 86 then transmits the computed time to the microprocessor 26 of FIG. 2.

The interval timer 32 may also be utilized to measure jitter in the Vin signal with a high degree of accuracy. Referring to FIGS. 1 and 2, when a repetitive signal such as Vin is subject to jitter, the period between successive triggering events T0–T4 varies. To accurately measure the time period between successive triggering events the input signal Vin may be applied to both trigger generator 21 and trigger generator 22 of FIG. 2 and the trigger generators 21 and 22 may be successively armed by arming controller 40 so that trigger generator 21 generates a trigger signal on detection of a first triggering event in the input waveform Vin while trigger generator 22 generates a trigger signal on the second triggering event in the input waveform Vin. Thus interval timer 32 measures the time difference between the two triggering events with high accuracy. Signal jitter is determined by comparing measured time difference between successive pairs of triggering events.

Thus according to the foregoing description the equivalent time pseudorandom sampling system of the present invention samples a repetitive waveform within each of several acquisition windows bounding repetitive sections of the waveform. In order to obtain equivalent time sample data characterizing the shape of the waveform included within each acquisition window, the period between successive triggering events is measured and sampling is delayed following an initiating triggering event by delay times adjusted according to the measured periods so as to maximize the probability that sampling will occur within each acquisition window. The time intervals between samples and triggering events are measured with high accuracy utilizing the above-described dual vernier interpolation time interval measurement system.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method for measuring a time interval between first and second events comprising the steps of:
  periodically generating a reference signal;

triggering first and second periodic signals on occurrence of said first and second events, respectively;

sampling said first and second periodic signals on each occurrence of said reference signal and determining the magnitude of each signal sample;

counting cycles of said first periodic signal occurring after triggering said first periodic signal and before the sampled magnitude of said first periodic signal crosses a predetermined level, thereby producing a first count;

counting cycles of said second periodic signal occurring after triggering said second periodic signal and before the sampled magnitude of said second periodic signal crosses said predetermined level, thereby producing a second count; and counting occurrences of said reference signal generated between a first moment when said sampled magnitude of said first periodic signal crosses said predetermined level and a second moment when said sampled magnitude of said second periodic signal crosses said predetermined level, thereby producing a third count.

2. The method according to claim 1 wherein said first and second periodic signals are of frequencies which differ from the frequency of said reference signal.

3. The method according to claim 2 further comprising the step of computing said time interval according to said first, second and third counts.

4. A method for sampling a repetitive waveform, the method comprising the steps of:

measuring a first time interval between first and second triggering events in said repetitive waveform; and generating in delayed response to a third triggering event in said repetitive waveform a strobe signal for initiating sampling of said repetitive waveform, the delay between said third triggering event and generation of said strobe signal being adjusted according to said measured time interval.

5. The method according to claim 4 wherein said delay is adjusted to equal the sum of said measured first time interval and a predetermined interval.

6. The method according to claim 4 wherein said delay is adjusted to equal the difference between said measured first time interval and a predetermined interval.

7. The method according to claim 4 further comprising the step of measuring a second time interval between said strobe signal and a fourth triggering event in said repetitive waveform.

8. The method according to claim 7 wherein the step of measuring said second time interval comprises the substeps of:

periodically generating a reference signal;

triggering a first periodic signal on occurrence of said strobe signal and triggering a second periodic signal on occurrence of said fourth triggering event;

sampling said first and second periodic signals on each occurrence of said reference signal and determining the magnitude of each signal sample;

counting cycles of said first periodic signal occurring after triggering said first periodic signal and before the sample magnitude of said first periodic signal crosses a predetermined level;

counting cycles of said second periodic signal occurring after triggering said second periodic signal and before the sample magnitude of said second periodic signal crosses a predetermined level; and counting occurrences of said reference signal generated between a first moment when said sampled magnitude of said first periodic signal crosses said predetermined level and a second moment when said sampled magnitude of said second periodic signal crosses said predetermined level.

9. An apparatus for measuring a time interval between first and second events comprising:

a reference oscillator for periodically generating a reference signal;

a first triggerable oscillator for generating a first periodic signal triggered by said first event;

a second triggerable oscillator for generating a second periodic signal triggered by said second event;

means for sampling said first and second periodic signals on each occurrence of said reference signal;

means for counting cycles of said first periodic signal occurring before the sampled magnitude of said first periodic signal crosses a predetermined level;

means for counting cycles of said second periodic signal occurring before the sampled magnitude of said second periodic signal crosses a predetermined level; and means for counting occurrences of said reference signal generated between a first moment when said sampled magnitude of said first periodic signal crosses said predetermined level and a second moment when said sampled magnitude of said second periodic signal crosses said predetermined level.

10. An apparatus for timing sampling of a repetitive waveform comprising:

means for measuring a first time interval between first and second triggering events in said repetitive waveform; and means for generating in delayed response to a third triggering event in said repetitive waveform a strobe signal for initiating sampling of said repetitive waveform, the delay between said third triggering event and generation of said strobe signal being set according to said measured first time interval.

11. The apparatus according to claim 10 wherein said delay is set equal to said measured first time interval adjusted by a predetermined interval.

12. The apparatus according to claim 10 further comprising means for measuring a second time interval between said strobe signal and a fourth triggering event in said repetitive waveform.

13. The apparatus according to claim 12 wherein said means for measuring said second time interval comprises:

means for periodically generating a reference signal;

a first triggerable oscillator for generating a first periodic signal when triggered by said strobe signal;

a second triggerable oscillator for generating a second periodic signal when triggered by said fourth triggering event;

means for sampling said first and second periodic signals on each occurrence of said reference signal;

means for counting cycles of said first periodic signal occurring after triggering of said first periodic signal and before the sampled magnitude of said first periodic signal crosses a predetermined level;

means for counting cycles of said second periodic signal occurring after triggering of said second periodic signal and before the sampled magnitude of said second periodic signal crosses said predetermined level; and means for counting occurrences of said reference signal generated after a first moment when said sampled magnitude of said first periodic signal crosses said predetermined level and a second moment when said sampled magnitude of said second periodic signal crosses said predetermined level.

* * * * *